United States Patent
Liehr et al.

(10) Patent No.: US 10,186,401 B2
(45) Date of Patent: Jan. 22, 2019

(54) PLASMA-CHEMICAL COATING APPARATUS

(71) Applicant: W & L Coating Systems GmbH, Reichelsheim (DE)

(72) Inventors: Michael Liehr, Buedingen (DE); Hans-Dieter Wurczinger, Bad Vilbel (DE)

(73) Assignee: W & L Coating Systems GmbH, Reichelsheim (DE)

( * ) Notice: Subject to any disclaimer, the term of this patent is extended or adjusted under 35 U.S.C. 154(b) by 395 days.

(21) Appl. No.: 14/906,027

(22) PCT Filed: Jul. 11, 2014

(86) PCT No.: PCT/EP2014/064954
§ 371 (c)(1),
(2) Date: Mar. 30, 2016

(87) PCT Pub. No.: WO2015/007653
PCT Pub. Date: Jan. 22, 2015

(65) Prior Publication Data
US 2016/0211122 A1    Jul. 21, 2016

(30) Foreign Application Priority Data
Jul. 18, 2013   (DE) .................. 10 2013 107 659

(51) Int. Cl.
*H01J 37/32*   (2006.01)
*C23C 14/35*   (2006.01)
(Continued)

(52) U.S. Cl.
CPC ........ *H01J 37/32899* (2013.01); *C23C 14/35* (2013.01); *C23C 16/44* (2013.01);
(Continued)

(58) Field of Classification Search
CPC .................................. H01J 37/32899
See application file for complete search history.

(56) References Cited

U.S. PATENT DOCUMENTS 5,203,924 A * 4/1993 Mitani .................... C23C 16/26
                                                    118/719
5,338,422 A * 8/1994 Belkind .............. C23C 14/0036
                                                    204/192.12
(Continued)

FOREIGN PATENT DOCUMENTS

DE          284 486 A5   10/1983
DE   10 2012 206 975 A1   1/2013
(Continued)

OTHER PUBLICATIONS

Espacenet. English-Language Abstract for DE 10 2012 206 975, Jan. 17, 2013.

*Primary Examiner* — Joseph A Miller, Jr.
(74) *Attorney, Agent, or Firm* — Tiajoloff & Kelly LLP

(57) ABSTRACT

In a known plasma-chemical coating apparatus, a plasma chamber is provided within which at least one linear antenna is arranged for producing a plasma by means of electromagnetic power, in which a supply for a carrier gas terminates and which comprises a plasma exit opening in the direction of a treatment chamber for a plasma-assisted modification of a substrate. Starting from this, to achieve cleaning cycles as in coating apparatuses with comparatively slow coating processes, it is suggested according to the invention that the plasma exit opening is configured as an elongated narrowing and defined preferably on both sides by cylinders which extend in parallel with each other and are rotatable about their cylinder axis, and that a cleaning zone is respectively provided for each of the cylinders, into which an area of the
(Continued)

Figure 1:
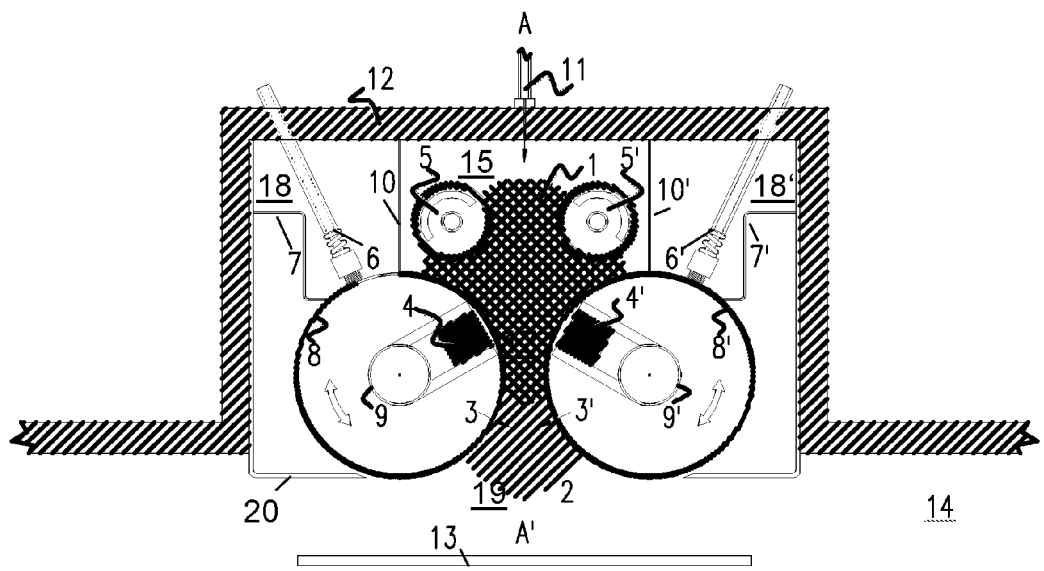

outer surface of the respective cylinder which is to be cleaned can be introduced by rotation about the cylinder axis.

14 Claims, 1 Drawing Sheet

(51) Int. Cl.
*C23C 16/44* (2006.01)
*C23C 16/452* (2006.01)
*C23C 16/455* (2006.01)
*C23C 16/511* (2006.01)
*C23C 16/515* (2006.01)

(52) U.S. Cl.
CPC ...... *C23C 16/452* (2013.01); *C23C 16/45578* (2013.01); *C23C 16/511* (2013.01); *C23C 16/515* (2013.01); *H01J 37/3222* (2013.01); *H01J 37/3244* (2013.01); *H01J 37/32357* (2013.01); *H01J 37/32669* (2013.01); *H01J 37/32798* (2013.01); *H01J 37/32862* (2013.01); *H01J 37/32889* (2013.01); *H01J 2237/327* (2013.01); *H01J 2237/3321* (2013.01); *H01J 2237/3326* (2013.01)

(56) References Cited

U.S. PATENT DOCUMENTS

| | | |
|---|---|---|
| 8,057,649 B2 | 11/2011 | Stowell et al. |
| 8,349,156 B2 | 1/2013 | Stowell et al. |
| 2002/0043937 A1* | 4/2002 | Ogura ............... H01J 23/005 315/39.51 |
| 2009/0277778 A1 | 11/2009 | Stowell et al. |
| 2009/0283400 A1 | 11/2009 | Stowell et al. |
| 2010/0078320 A1 | 4/2010 | Stowell |
| 2010/0330300 A1 | 12/2010 | Stowell |

FOREIGN PATENT DOCUMENTS

| | | |
|---|---|---|
| WO | 2009096951 A1 | 8/2009 |
| WO | 200909096954 A1 | 8/2009 |

* cited by examiner

PLASMA-CHEMICAL COATING APPARATUS

TECHNICAL FIELD

The present invention refers to a plasma-chemical coating apparatus comprising a plasma chamber within which at least one linear antenna is arranged for producing a plasma by means of electromagnetic power, a supply for a carrier gas terminates in said plasma chamber, and said plasma chamber comprises a plasma exit opening in a direction of a treatment chamber for a plasma-assisted modification of a substrate.

Such plasma-chemical coating apparatuses and processes have been known for a long time and are used for the deposition of ceramic, organic and also conductive or semi-conductive thin (nanometer to low micrometer range) layers.

Plasma-chemical coating processes (plasma enhanced chemical vapor deposition, PECVD) are often based on the chemical activation of organometallic compounds with the addition of oxidizing or reducing gaseous substances under the action of plasma discharges, mostly under vacuum conditions, which are operated with electrical or electromagnetic energy.

PRIOR ART

A coating apparatus for the treatment of a surface of a substrate by way of plasma-assisted chemical gas phase deposition according to the above-mentioned type is known from WO 2009/096954 A1. It comprises a plasma chamber for producing a plasma zone which is lined with a dielectric layer. An enhanced plasma density can thereby be achieved. The plasma chamber surrounds a tube for the supply of a plasma-forming carrier gas and an elongated antenna for producing a plasma zone by way of electromagnetic power. In one embodiment, it has a substantially triangular cross-sectional profile with a downwardly oriented flattened tip which forms an opening of the plasma chamber toward a coating zone with the substrate to be coated. The profile increases the flow resistance for the carrier gas flowing within the plasma chamber from the broad upper end downwards, and thus the excitation period thereof in the plasma zone and thus the ionization effect of the plasma.

By comparison with other coating methods, such as for instance the deposition of thin layers with the help of magnetron sputtering, plasma-chemical deposition processes are distinguished by high deposition rates. High deposition rates are in principle desired because they stand for high productivity and are thus economically useful.

However, on the other hand, high deposition rates on substrates which after coating with the predetermined layer thickness are periodically replaced by new substrates also mean a rapid self-coating of walls and parts of the plasma-chemical coating apparatus. This is acceptable as long as the growing layers do not at least partially detach or flake and pass as dust, contamination or flaking onto the substrate surfaces. It is then at the latest that the system has to be cleaned.

To keep the productive times between successive cleaning cycles of the coating apparatus as long as possible, many suggestions have been made, for instance roughening or structuring the surfaces to achieve improved adhesion of the deposition layer or a reduction of the mechanical internal stress.

DD 284 486 A5, for instance, recommends the application of a negative voltage to the plasma chamber. The layer formation is thereby carried out, like on the substrate itself, under additional ion action, which is to improve the density and bond strength of the deposited layers.

DE 10 2012 206 975 A1 informs about a system for the dynamic plasma-assisted treatment of plate-shaped substrates in vacuum according to the continuous flow principle. The substrates are here transported through a vacuum chamber by means of a driven endless belt. Above the substrate plane, a plurality of HF/VHF electrodes are provided at a short distance from one another, and an elongated counter electrode is arranged underneath the substrate plane. The endless belt simultaneously serves the transportation of the substrates and as a coating and removal protection for the counter electrode. Moreover, a heater is provided for the indirect heating of the counter electrode and the endless belt. The endless belt is guided within the vacuum chamber such that the upper section is guided through the treatment reactor and the lower section through the cleaning chamber to clean the endless belt during operation of the vacuum treatment system chemically, thermally or mechanically. Deposited layers, for instance, can here be removed by means of the heater by way of evaporation.

U.S. Pat. No. 8,349,156 B2 (and U.S. Pat. No. 8,057,649 B2) discloses a system used for coating by way of microwave-assisted sputtering, in which two tube targets that are arranged in parallel with each other are rotatably supported about their longitudinal axis. Furthermore, a linear antenna is provided for producing plasma, as well as a gas supply above the antenna.

Technical Object

Despite all measures, the production cycles of plasma-chemical coating processes are often too short. This is particularly noticeable whenever plasma-chemical coating apparatuses are operated together with other coating apparatuses, such as for instance magnetron sputter sources, in a joint system. In this case it is optimal from an economic point of view when all coating apparatuses have the same cleaning cycle to keep the unproductive times of coating systems as short as possible.

It is therefore the object of the present invention to indicate a plasma-chemical coating apparatus in which additional measures are taken to achieve cleaning cycles as in coating apparatuses with comparatively slow coating processes.

General Description of the Invention

This object, starting from a coating apparatus of the above-mentioned type, is achieved according to the invention in that the plasma exit opening is configured as an elongated narrowing and defined by at least one cylinder which is rotatable about its cylinder axis, and that a cleaning zone is provided into which an area of an outer surface of the cylinder which is to be cleaned can be introduced by rotation about the cylinder axis.

The plasma exit opening is slit-shaped, elongated with a narrowing. Excited particles pass therethrough from the plasma chamber into a coating chamber in which the substrate to be treated is positioned. The area with excited particles is also referred to here and in the following as a plasma zone, independently of any visually visible emission. Hence, the plasma zone extends from an area, which is proximal from the viewpoint of plasma generation, above the plasma exit opening through said opening into a distal area, below the plasma exit opening, which can be assigned to the coating chamber. The substrate is moved transversely to the plasma exit opening and is thereby treated by means of the plasma, or a layer is deposited on its surface; in this case, a layer gas assisting in the layer deposition is here introduced distal to the narrowing.

The elongated, slit-shaped plasma exit opening is defined according to the invention at least on one side by a cylinder; preferably, however, it is defined on both sides by a respective cylinder, i.e. a total of two cylinders. The cylinder consists for instance of a plasma-resistant material or of a material sputtered by means of the plasma. The other delimitation of the plasma exit opening is formed by a wall of the plasma chamber or by another elongated component within the coating apparatus, preferably by a further second cylinder.

This configuration of the exit opening has several advantageous effects:

The delimitation of the plasma exit opening on both sides by at least one outer cylinder surface with a circular cross-section forms the narrowing or constriction of the opening. Hence, it has a locally defined minimal width which rapidly increases upwards and downwards according to the outer diameter of the cylinder. The plasma-forming carrier gas which flows from above the exit opening into the plasma chamber, as well as the charged particles that are already formed in the plasma are given a higher flow velocity toward the substrate in the area of this constriction. The higher flow velocity prevents or reduces an inflow of layer gas and layer gas constituents into the plasma chamber. This reduces a deposition of layer-forming material in the area of the plasma chamber proper and particularly on the antenna. By lateral displacement of the cylinder the width of the narrowing can be adjusted such that an adequate flow of the plasma-activated carrier gas is achieved toward the substrate on the one hand, and an amount of the layer gas that is as small as possible flows back toward the linear antennae for plasma generation on the other hand.

The cylinder is rotatable about its cylinder axis such that a cylinder surface part to be cleaned can be moved by rotation into a cleaning zone. The cleaning of the surface of the circular cylinder does not require any long downtimes or a dismounting of the cylinder and is thus relatively easy. The outer surface area to be cleaned is moved by rotation into the cleaning zone and treated there. Suitable treatment methods will still be explained further below. The cleaning zone is preferably spatially separated from the plasma chamber and the coating area, e.g. by means of partition walls.

The cylinder adjoins both the plasma chamber and the coating area. Preferably, the cylinder is configured as a hollow cylinder, i.e. it has a cavity which allows measures that have an impact on the electrical, thermal or chemical conditions of the plasma chamber and the coating area. These measures include e.g. local heating or cooling, the application of electric or magnetic fields, and particularly preferably the supply of a layer gas. For this purpose the cylinder is provided with a supply for the layer gas in an area distal to the narrowing. A "layer gas" is here a gas which directly or indirectly contributes to the formation of a coating on the substrate—after decomposition or reaction with another component.

Preferred is an embodiment of the plasma-chemical coating apparatus in which the plasma exit opening is defined on both sides by cylinders which extend in parallel with each other and are rotatable about their respective cylinder axis.

The plasma exit opening which is defined by cylinders on both sides shows a particularly pronounced narrowing. Both cylinders extend in parallel with each other and, in the simplest and preferred case, are of the same design and arranged at the same height position within the apparatus. The cylinders can extend over the whole length of the plasma chamber and have each a cleaning zone into which an area of the outer cylinder surface which is to be cleaned can be introduced by rotation about the respective longitudinal axis thereof. Preferably, both cylinders are designed as hollow cylinders, so that each has a cavity which allows a mirror-symmetrical configuration of the above-explained measures that have an impact on the electrical, thermal or chemical conditions of the plasma chamber and the coating area.

For the generation of a plasma which is homogeneously acting on the substrate, a mirror-symmetrical configuration is of advantage. Therefore, the plasma chamber and the plasma exit opening are preferably mirror-symmetrical with respect to a mirror plane defined by the plasma exit opening.

The narrowing of the plasma exit opening is here formed by two cylinders that are opposite in parallel at a height position and have the same outer diameter.

To prevent the backflow of layer gas into the plasma chamber toward the antenna as efficiently as possible, the layer gas is supplied to the plasma chamber or the coating area in a place distal to the constriction of the plasma exit opening. In a particularly advantageous embodiment of the coating apparatus it is provided for this purpose that the at least one cylinder is configured as a hollow cylinder and comprises at least one nozzle which serves as a supply for the layer gas.

The nozzle may e.g. form an outlet of a gas supply system extending within the hollow cylinder. In the simplest case, it is designed as a through hole of the cylinder jacket, e.g. as a slotted nozzle, or a plurality of individual nozzles are provided arranged one after the other in the direction of the cylinder axis. The outflow direction of the layer gas can be changed relatively easily by rotating the hollow cylinder. In the particularly preferred embodiment of the coating apparatus with two hollow cylinders defining the plasma exit opening, one of the two cylinders or both cylinders have a supply for a layer gas into the area distal to the narrowing of the plasma exit opening, i.e. such a nozzle and a gas supply system.

It has turned out to be useful when at least two linear antennae are provided for plasma generation with the help of electromagnetic power, which antennae are arranged in parallel with each other. At least one of the linear antennae and preferably at least two of the linear antennae are arranged in the plasma chamber such that they extend laterally offset to a normal projection onto the plasma exit opening.

In a view of the coating area in the direction of the plasma chamber, the antennae are here laterally offset and shaded by the cylinder or by the two cylinders.

In a preferred embodiment, it is provided that the cylinder is electrically insulated with respect to a plasma chamber wall and connected to a voltage or power source. The cylinder (and possibly each cylinder) can thereby be heated for instance electrically, whereby the deposition of a layer can be prevented or slowed down. Or it can be acted upon with a positive or negative electric potential such that its outer cylinder surface has a repelling or attracting effect on positively charged particles.

The repelling effect counteracts a deposition of charged particles, such as ions or molecule fragments. The attracting effect accelerates the charged particles toward the outer cylinder surface and can thereby sputter already existing deposited layers.

In addition or as an alternative, the cleaning zone is equipped with a mechanical cleaning device which acts on the outer cylinder surface of the cylinder.

The mechanical cleaning device comprises for instance strippers or brushes. These components are in permanent contact, for instance in the cleaning zone, with the respective outer cylinder surface, or they are brought into contact therewith for the purpose of cleaning. Due to the contact the movement about the cylinder axis alone already achieves a cleaning of the outer surface. The mechanical cleaning of the cylinder surface can be supported and simplified by other measures. For instance an existing deposit can be detached in part from the surface by previously heating the cylinder(s) or can be mechanically weakened (for instance by introduction of mechanical stresses or crack formation) such that its subsequent mechanical removal from the surface is facilitated.

In a particularly preferred design of the coating apparatus according to the invention, the cylinder is formed as a hollow cylinder and encloses a plurality of permanent magnets which are arranged in a row along the longitudinal cylinder axis.

The arrangement of the permanent magnets creates a static, magnetic field acting on the plasma zone, which locally enhances the electron density in the plasma. For this purpose the permanent magnets are preferably mounted directly on the inner wall of the hollow cylinder or in the vicinity thereof. Their magnetization directions extend respectively radially or tangentially with respect to the hollow cylinder.

The permanent magnets are preferably mounted in a holding device which is rotatable about a rotational axis extending coaxial to the longitudinal axis of the hollow cylinder.

The holding cylinder is respectively positioned within the hollow-cylinder inner bore. By rotating the holding device about its rotational axis (which extends coaxial to the respective longitudinal cylinder axis), the position of the permanent magnets and thus their action on the plasma can be changed. For freely positioning the permanent magnets the holding device is rotated about its rotational axis independently of the rotation of the hollow cylinder about the longitudinal axis of the hollow cylinder. The wall of the hollow cylinder shields the permanent magnets against the plasma and the high-frequency waves of the excitation field. The geometric contour of the magnets, and particularly possible edges, has no or only a small influence on the field distribution. The round outer wall of the hollow cylinder forms an opposite pole and grounding surface for the excitation field. This has the consequence that there will be no noticeable change in the shape of the opposite pole for the excitation field upon rotation of the permanent magnets about the rotational axis of the holding device and that there will be in this respect no or only a comparatively minor impact on the field distribution. This facilitates the empirical finding of an optimal position and location of the permanent magnets. In the preferred embodiment with two hollow cylinders defining the plasma exit opening, both hollow cylinders show such an arrangement of permanent magnets.

In a particularly compact and simple embodiment of the coating apparatus according to the invention, the plasma chamber is defined by a chamber wall comprising the plasma exit opening, at least a part of the chamber wall being formed by the at least one cylinder.

EMBODIMENT

The invention shall now be explained in more detail with reference to an embodiment and a drawing. In detail in a schematic illustration, FIG. 1 shows a cross section of an embodiment of the elongated plasma-chemical coating apparatus according to the invention, and FIG. 2 shows the coating apparatus of FIG. 1 in a longitudinal section along a plane AA'

Figure 2:
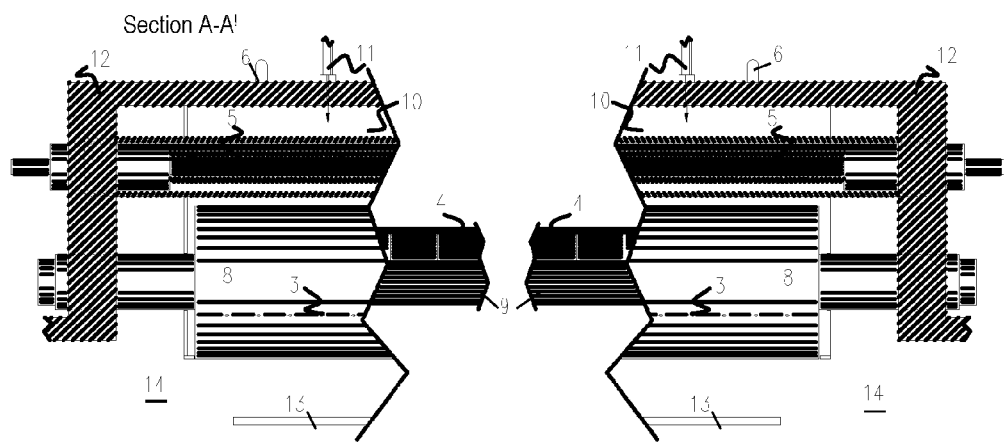

In the embodiment of an elongated plasma-chemical coating apparatus as shown in FIG. 1, two linear antennae 5; 5' for producing a plasma 1 and a gas supply 11 for a plasma-forming carrier gas are arranged within a vacuum-tight housing 12. The plasma chamber 15 is open downwards toward a coating chamber 19 with a substrate 13 arranged therein. The opening 17 is defined by two cylindrical tubes 8; 8' which extend in parallel with each other at a predetermined distance, thereby forming the elongated opening 17 which is narrowed in the illustrated cross-section. The tubes 8; 8' thereby form a part of the chamber wall 20 of the housing 12 which separates the plasma chamber 15 from the coating chamber 19. Cleaning chambers 18; 18' with a respective cleaning device 6; 6' are disposed, spatially divided from the plasma chamber 15 by partition walls 7, 7'; 10; 10'.

The cylindrical tubes 8; 8' also serve the introduction of gaseous or vaporous layer-forming substances into the mixing volume 2 via suitable nozzles. To this end the walls of the tubes 8; 8' are each provided with a number of through holes. These form gas nozzles 3; 3' for the supply of gaseous or vaporous substances which are fractionalized in the plasma 1 and react to form coatable molecule fragments. The number of gas nozzles 3; 3' are arranged for this purpose such that the substances flowing out therefrom pass directly into the coating chamber 19, i.e. into an area distal to the narrowed opening 17, into the plasma 1.

The flow direction of the substances and the place where the substances are introduced can be freely chosen by positioning the nozzles by rotating the cylindrical tubes 8; 8' around the longitudinal axes thereof along the tube arc so as to ensure optimal layer deposition conditions on the substrate.

The rotatability of the tubes 8; 8' around their longitudinal axis thereby serves to move surface areas to be cleaned into the cleaning chambers 18; 18' and to orient the gas nozzles 3; 3' for the supply of the coating gas.

A multitude of permanent magnets 4; 4' are arranged within the tube 8; 8' in a row. The permanent magnets 4, 4' with their corresponding holding devices can be rotated in their position relative to the linear antennae 5; 5' and the plasma discharge 1 along a circular arc about the longitudinal axis of the cylindrical tubes 8; 8' with the help of a holding and rotating device 9; 9' to achieve optimal operating conditions for the plasma-chemical coating process. This is particularly of importance when the coating apparatus is operated at a low gas pressure ($10^{-3}$ to $10^{-2}$ hPa).

The row of the gas nozzles 3; 3' is visible in the view of FIG. 2, as well as the arrangement of the permanent magnets 4; 4' in rows within the tubes 8, 8'.

In the embodiment the tubes 8; 8' are made of stainless steel and have a length of 3 m and an outer diameter of 15 cm. They are arranged such that the longitudinal gap 17 remaining between them has a minimal gap width of 20 mm.

The nozzles 3; 3' are designed as through holes with a round cross-section and typically have an outer diameter in the range of 0.5-2 mm; in the embodiment, this is 1 mm at a center distance of 10 mm. They are positioned such that the connection line of the longitudinal axis of the tube and the nozzle center encloses an angle of −20° with the horizontal. The nozzle diameters and distances are adapted to the respective coating process. These parameters can also vary over the length of the tube 8; 8'. In an alternative embodiment (not shown in the figures), the nozzle distances, for instance, on the front-side tube ends differ from those in the tube center.

The permanent magnets consist of typical magnetic materials, such as alloys, also CoSm or FeNdB. In the embodiment, magnets of FeNdB alloy are used because of their enhanced magnetic field strength. As can be seen in FIG. 2, they are arranged, if possible without any space, in a row which is positioned such that the connection line of the longitudinal axis of the tube and the point at which the center axis of the permanent magnets intersects the circumferential line of the tube encloses an angle of +20° with the horizontal.

The functions and the operation of the apparatus according to the invention shall now be explained in more detail with reference to FIGS. 1 and 2.

The substrate 13 to be coated moves within a suitable vacuum environment 14 in the plane of drawing from the left to the right side, or vice versa. A first oxidizing or reducing gas or gas mixture is introduced in metered amounts via the gas inlet 11 into the vacuum area of the linear antennae 5; 5' and is activated by the spatially expanded plasma discharge 1, i.e. dissociated, ionized or energetically excited. The linear antennae 5; 5' are designed such that they distribute the electrical or electromagnetic power as uniformly as possible along the longitudinal axis of the coating apparatus.

To sustain the plasma discharge also at a very low gas pressure, a static magnetic field is produced with the help of the permanent magnets 4; 4' in the vicinity of the linear antennae 5; 5' to counteract the electron loss from the plasma 1 and the possible extinction of the plasma discharge. Plasma heating can also be achieved through the effect of electron cyclotron resonance and other resonant heating mechanisms if the magnetic flux and the vacuum conditions are adequate for this.

The excited carrier gas diffuses due to a pressure gradient through the narrowed opening 17 which is formed by the two cylindrical tubes 8; 8', and reaches the mixing volume 2 where a second layer-forming gas or gas mixture, a vapor or vapor mixture from the cylindrical tubes 8; 8' is introduced in metered amounts via the correspondingly dimensioned nozzles 3; 3'. Due to the mixing of the gaseous or vaporous substances under advantageous gas pressure conditions the layer-forming constituents are energetically activated, dissociated or also ionized, so that a layer of desired consistency and layer thickness is deposited on the substrate 13 at a sufficiently high rate.

Thereupon the coated substrate is replaced by an uncoated substrate. The coating can be applied statically (substrate does not move during the coating process) or dynamically. The activated constituents in the mixing volume 2, however, coat not only the substrates, but also the cylindrical tubes 8; 8'. Since the outer tube surfaces are constantly exposed to the coating process, dusty and/or thick layers will form over time that more and more tend to overcome the adhesion forces toward the tube surfaces due to the rising internal stress, and tend to detach or flake. This must be avoided, for layer fragments may land on substrate surfaces and may thereby have a strong negative impact on the efficiency of the coating system. Moreover, it may happen that the nozzles 3; 3' get clogged by self-coating, and the necessary layer uniformity on the substrates 13 is thus no longer ensured.

According to the invention the formation of self-coating is already slowed down by the narrowed opening 17 between plasma chamber 15 and coating chamber 19. The reason is that due to the narrowed opening 17 the ionized carrier gas flows from above downwards and prevents or reduces a backflow of the substances or coatable particles formed therefrom into the plasma chamber 15. This measure counteracts the deposition of layers on the walls within the plasma chamber 15, particularly on the antennae 5; 5' and the tubes 8; 8'. Nevertheless, such layers may form in the course of time.

To prevent the formation of thick layers on the surfaces, three further measures are suggested according to the invention.

The first measure serves to keep the self-coating rates as low as possible by keeping a part or all surfaces of the plasma-chemical coating apparatus that are exposed to self-coating, at an elevated temperature, for it is already known that with a rising surface temperature the desorption rates of already deposited constituents of the coatable vapor or gas or vapor or gas mixtures are generally rising. Due to this process opposed to the coating process, the self-coating rates can be reduced considerably.

For this purpose the surfaces of the plasma-chemical coating apparatus that are exposed to self-coating, i.e. the cylindrical tubes 8, 8', the partition walls 10; 10', and parts of the vacuum-tight housing 12 or their possible metallic inner wall linings (not depicted in FIGS. 1 and 2), are heated by indirect or direct heating to an elevated suitable temperature. For instance, the constructional design of the cylindrical tubes 8, 8' may be such that the tubes can be heated via electric currents to prevent condensation of vaporous, layer-forming substances within the tubes and to simultaneously slow down the self-coating process on the outer tube surface. Preferably, the temperature range is between 200° C. and 400° C. It is only the thermal stability of the used materials that has a restrictive effect.

The second measure serves to keep the self-coating rates as low as possible by subjecting a part or all surfaces of the plasma-chemical coating apparatus which are exposed to self-coating, to a static electric potential which is different from the ground potential of the remaining coating apparatus to reduce either the self-coating rates by way of an attracting or repelling effect on the positively charged ions or molecule fragments of the plasma discharge or to remove self-coating again that already exists due to sputter effects.

For this purpose the surfaces of the plasma-chemical coating apparatus which are exposed to self-coating, i.e. the cylindrical tubes 8; 8', the partition walls 10; 10', and parts of the vacuum-tight housing 12 or their possible metallic inner wall linings, are designed such that they can be acted upon with an electric potential. This electric potential may be positive with respect to the remaining potential of the coating apparatus, so that positively charged ions of the plasma discharge are prevented from reaching the said surfaces, from recombining with electrons into neutral molecules or atoms and from contributing to self-coating. The electric potential can be negative with respect to the remaining potential of the coating apparatus, so that positively charged ions or molecule fragments of the plasma discharge are accelerated toward the said surfaces and already existing layers are removed by way of the sputter effect. The exposure of the said surfaces to negative electric potential must be intermittently interrupted so as to prevent a situation where after complete removal of the self-coating the original surface material is removed and introduced into the gas phase and thereby contaminates the intended substrate coating.

The third measure serves to expose the surfaces of the plasma-chemical coating apparatus, which over a rather long operation period are subject to a pronounced self-coating despite the first measure, to interim cleaning processes without shutting down the whole coating system and to ventilate the system, which would in fact be required to mechanically clean the coating apparatus or to replace heavily coated parts.

For this purpose the cylindrical tubes 8; 8' are rotated during short interruptions of the coating processes, while maintaining the vacuum pressure conditions, at regular time intervals or in case of need. Due to the rotation the tubes are cleaned mechanically or in another way while passing by mechanical or other cleaning devices, such as the brushes 6; 6'. Nozzles 3; 3' can here also be cleaned and freed of deposits. The rotation can take place alternatingly clockwise or anticlockwise several times and for such a long time that the cylindrical tube surfaces are sufficiently freed of self-coating.

The cleaning device 6; 6' may be of a static or dynamic mechanical design, such as for instance brushes, also rotating brushes which are in direct frictional contact with the tube surface. However, other methods, such as ultrasound, can also be used. The removed layer material is then collected in the spatial volume formed along the longitudinal axis of the coating apparatus together with the partition walls 7; 10 until the next main cleaning process.

The three suggested measures can be taken as individual measures, in pairs, but also in their entirety.

An essential prerequisite for a homogeneous coating over large substrate dimensions is a very uniform plasma discharge 1. This can e.g. be achieved by using antenna structures 5; 5' that are configured as waveguides of a coaxial type, and they consist of a metallically conducting cylindrical inner conductor, a concentric, partly open or entirely missing cylindrical outer conductor and of a cylindrical, concentric and surrounding tube of a temperature-resistant, dielectric, non-power-absorbing material. In these coaxial cables the metallic outer conductor is removed altogether or partly. Since the coaxial cables are respectively surrounded by cylindrical tubes of vacuum-tight, temperature-resistant and non-absorbing dielectric material in the interior of which atmospheric pressure is prevailing, plasma discharges are observed at the places where the metallic outer conductors of the coaxial cables are missing, on the outer surfaces of the dielectric tubes when the coaxial cables are acted upon with electromagnetic power, as described in more detail in DE 41 36 297 A1.

Apart from the selection of suitable linear antennae, it is of advantage to a uniform plasma discharge to supply the electromagnetic power in the form of pulses to the discharge. Preferably, the linear antennae 5; 5' that are arranged in parallel with each other are therefore acted upon for the generation of plasma 1 with electromagnetic power of high frequencies, preferably frequencies in the single-digit gigahertz range.

The actuation with electromagnetic power is here carried out in pulsed form, wherein the pulse heights are much higher than the corresponding continuous wave power and the pulse-on times are short in comparison with the pulse-off times, and wherein the pulse repetition frequencies are so high that the time between two successive pulses is shorter than the mean recombination time of charge carriers in a plasma discharge.

Very high pulse powers should be preferred in the case of short pulse-on and long pulse-off times. For instance, if an equivalent continuous wave power of 1 kW is exposed to a plasma discharge, it is of advantage to a uniform plasma discharge that this is done in the form of pulses with a pulse height of 10 kW at a pulse-on time of 10% and a pulse-off time of 90% of a pulse period. High pulse repetition frequencies should here be preferred. Pulse repetition frequencies of 5 kHz and more ensure that the time between two successive pulses is shorter than the mean recombination time of electrons and ions in a plasma.

The invention claimed is:

1. A plasma-chemical coating apparatus comprising:
    a plasma chamber having at least one linear antenna arranged therein so as to produce a plasma by electromagnetic power,
    a carrier gas supply terminating in said plasma chamber and supplying a carrier gas thereto, and
    said plasma chamber having a plasma exit opening in a direction of a treatment chamber configured to provide a plasma-assisted modification of a substrate,
    wherein the plasma exit opening is a narrowing that is defined by at least one cylinder supported for rotation about a cylinder axis thereof so that said narrowing extends lengthwise of said cylinder, and
    wherein the apparatus has a cleaning zone into which an area of an outer surface of the cylinder is introduced by rotation about the cylinder axis and cleaned in said cleaning zone, said cleaning zone having a mechanical cleaning device acting on the outer surface of the cylinder and comprising strippers or brushes.

2. The plasma-chemical coating apparatus according to claim 1, wherein the apparatus further comprises a layer gas supply supplying a layer gas in an area distal to the narrowing.

3. The plasma-chemical coating apparatus according to claim 1, wherein a second cylinder is supported for rotation about a cylinder axis thereof and extends in parallel with the first cylinder, and the plasma exit opening being defined on two sides by said cylinders.

4. The plasma-chemical coating apparatus according to claim 1, wherein the plasma chamber and the plasma exit opening are mirror-symmetrical with respect to a mirror plane extending through the plasma exit opening.

5. The coating apparatus according to claim 1, wherein the cylinder is electrically insulated relative to a plasma chamber wall and is connected to a voltage or power source.

6. The coating apparatus according to claim 5, wherein the cylinder can be acted upon with a positive or negative electric potential such that its outer cylinder surface has a repelling or attracting effect on positively charged particles.

7. The coating apparatus according to claim 1, wherein the cylinder is a hollow cylinder and encloses a plurality of permanent magnets that are arranged in a row along the cylinder axis.

8. The coating apparatus according to claim 7, wherein the permanent magnets are mounted in a holding device that is rotatable about a rotational axis extending coaxial to the cylinder axis of the cylinder.

9. The coating apparatus according to claim 1, wherein the plasma chamber is defined by a chamber wall with the plasma exit opening therein and at least a part of the chamber wall is formed by the-cylinder.

10. A plasma-chemical coating apparatus comprising:
a plasma chamber having at least one linear antenna arranged therein so as to produce a plasma by electromagnetic power,
a carrier gas supply terminating in said plasma chamber and supplying a carrier gas thereto, and
said plasma chamber having a plasma exit opening in a direction of a treatment chamber configured to provide a plasma-assisted modification of a substrate,
wherein the plasma exit opening is a narrowing that is defined by at least one cylinder supported for rotation about a cylinder axis thereof so that said narrowing extends lengthwise of said cylinder, and
wherein the apparatus has a cleaning zone into which an area of an outer surface of the cylinder is introduced by rotation about the cylinder axis and cleaned in said cleaning zone, and
wherein the apparatus further comprises a layer gas supply supplying a layer gas in an area distal to the narrowing, and
wherein the cylinder is a hollow cylinder and comprises a nozzle which serves as the layer gas supply.

11. The coating apparatus according to claim 1, wherein the cylinder is a hollow cylinder and comprises a nozzle which serves as the layer gas supply.

12. The coating apparatus according to claim 10, wherein a second linear antenna is arranged in parallel with the first linear antenna and the two linear antennae generate plasma with electromagnetic power, and the first and second linear antennae are arranged in the plasma chamber so as to extend laterally offset to a normal projection onto the plasma exit opening.

13. The coating apparatus according to claim 10, wherein the linear antenna is arranged in the plasma chamber so as to extend laterally offset to a normal projection onto the plasma exit opening.

14. A plasma-chemical coating apparatus comprising:
a plasma chamber having at least one linear antenna arranged therein so as to produce a plasma by electromagnetic power,
a carrier gas supply terminating in said plasma chamber and supplying a carrier gas thereto, and
said plasma chamber having a plasma exit opening in a direction of a treatment chamber configured to provide a plasma-assisted modification of a substrate,
wherein the plasma exit opening is a narrowing that is defined by at least one cylinder supported for rotation about a cylinder axis thereof so that said narrowing extends lengthwise of said cylinder, and
wherein the apparatus has a cleaning zone into which an area of an outer surface of the cylinder is introduced by rotation about the cylinder axis and cleaned in said cleaning zone, and
wherein a second linear antenna is arranged in parallel with the first linear antenna and the two linear antennae generate plasma with electromagnetic power.

* * * * *